United States Patent
Tsai et al.

(10) Patent No.: US 6,992,954 B2
(45) Date of Patent: Jan. 31, 2006

(54) METHOD FOR DETERMINING DC LEVEL OF AC SIGNAL AND DC OFFSET OF THE SAME

(75) Inventors: Chin-Yin Tsai, Taipei (TW); Keng-Lon Lei, Taipei (TW)

(73) Assignee: Via Optical Solutions, Inc., Taipei (TW)

( * ) Notice: Subject to any disclaimer, the term of this patent is extended or adjusted under 35 U.S.C. 154(b) by 385 days.

(21) Appl. No.: 10/208,291

(22) Filed: Jul. 30, 2002

(65) Prior Publication Data

US 2003/0174601 A1    Sep. 18, 2003

(30) Foreign Application Priority Data

Mar. 13, 2002  (TW) ................................ 91104718 A

(51) Int. Cl.
*G11B 5/09*    (2006.01)
(52) U.S. Cl. .................................. 369/44.32; 369/47.17
(58) Field of Classification Search ............. 369/44.36, 369/44.29, 44.34, 44.35, 44.25, 47.35, 59.21
See application file for complete search history.

(56) References Cited

U.S. PATENT DOCUMENTS

| | | | |
|---|---|---|---|
| 4,827,191 A * | 5/1989 | Chapman .................... 341/132 |
| 5,194,865 A * | 3/1993 | Mason et al. ................ 341/132 |
| 5,544,136 A * | 8/1996 | Horie ........................ 369/44.34 |
| 5,724,653 A * | 3/1998 | Baker et al. ................. 455/296 |
| 5,926,445 A * | 7/1999 | Sasaki et al. ............. 369/44.25 |
| 6,314,278 B1 * | 11/2001 | Zamat ...................... 455/239.1 |
| 6,556,635 B1 * | 4/2003 | Dehghan .................... 375/345 |
| 6,606,286 B1 * | 8/2003 | Maekawa ................. 369/47.17 |
| 6,781,938 B2 * | 8/2004 | Nanba et al. ............. 369/59.22 |

\* cited by examiner

*Primary Examiner*—Brian E. Miller
(74) *Attorney, Agent, or Firm*—Madson & Metcalf

(57) ABSTRACT

A method for determining a direct current (DC) level involved in an alternating current signal is provided. The alternating current signal is transmitted from an amplifier to an A/D (analog-to-digital) converter. When any of the extreme values of the alternating current signal is beyond the input range of the A/D converter, the alternating current signal is shifted to make both of the peak and bottom values located within the input range of the A/D converter. Then, the real extreme values are realized according to the shift level(s), the relative peak and bottom values realized after the shifting procedure, and the input range of the A/D converter. Finally, the DC level is determined according to the real peak and bottom values.

13 Claims, 5 Drawing Sheets

METHOD FOR DETERMINING DC LEVEL OF AC SIGNAL AND DC OFFSET OF THE SAME

FIELD OF THE INVENTION

The present invention relates to a method for determining a direct current (DC) level of an alternating current signal, and particularly to a method for determining a DC level of an alternating current signal with an extreme value beyond an input range of an analog-to-digital (A/D) converter. The present invention also relates to a method for realizing the extreme value as well as offsetting a voltage drift of the alternating current signal.

BACKGROUND OF THE INVENTION

Optical disks such as compact disks (CDs), video compact disks (VCDs) and digital versatile disk (DVDs) are playable by optical storage devices. When an optical pickup head of an optical storage device operates, the light emitted by a light source such as a laser diode is focused by an object lens of the optical pickup head on an optical disk, and the light reflected by the optical disk is transmitted to a light sensor to realize information from the disk. Referring to FIG. 1, the optical pickup head 10 moves along two main directions, i.e. a direction perpendicular to the disk surface, referred as a focusing direction F, and a direction parallel to the disk surface, referred as a tracking direction T.

During operation, a focusing error and a tracking error usually arise on the rotating disk. The focusing error is generally caused by vibration of the disk in the focusing direction F, and the tracking error is caused by eccentricity of the disk in the tracking direction T. To correct these errors, a tracking control system for an optical pickup head was developed, as can be seen in FIG. 2. The optical pickup head 20 has six light receiving parts A, B, C, D, E and F for producing output signals, when receiving light reflected from the optical disk. The output signals e and f are amplified through an amplifier 21 to produce a tracking error signal TE.

FIGS. 3(a), 3(b) and 3(c) respectively show three possible situations of tracking error signals. Referring first to FIG. 3(a), an ideal tracking error signal TE1 is an alternating current (AC) signal distributing in a preset amplitude range without any direct current (DC) component effect. That is, the DC level of the AC signal is preferably zero. The waveform of the tracking error signal TE1 is symmetrical with respect to the zero level 0. It is known to those skilled in the art that the zero level, which indicates the best tracking condition, is an index for performing a feedback control. In practice, however, the voltage level of the tracking error signal might be shifted upward or downward due to the presence of the DC effect, as the signal TE2 shown in FIG. 3(b). The tracking error signal TE2, although distributing within the input range of the following A/D converter, has an average voltage Vf, which is deviated from the zero level to some extent. In order to overcome the above-described problem, a tracking balance operation is performed with reference to FIG. 2. After the tracking error signal TE2 is converted into a digital signal by an analog-to-digital (A/D) converter 22, a peak and a bottom values of such digital signal are then detected by a peak detector 23 and a bottom detector 24, respectively. Based on the peak and bottom values, the tracking balance device 25 computes the drift voltage Vf of the FIG. 3(b) to realize a deviation amount of the DC level of the tracking error signal TE2 from the zero level. The deviation amount is then fed back to and offset by the amplifier 21 to remove the DC component effect from the tracking error signal TE2.

In the third situation shown in FIG. 3(c), the tracking error signal TE3 is beyond an upper limit Dmax and a lower limit Dmin of the A/D converter 22. Under this circumstance, correct peak and bottom values cannot be obtained to proceed subsequent DC-level determination and voltage-drift offset operations.

SUMMARY OF THE INVENTION

Therefore, the present invention provides a method for realizing extreme values of an AC signal when the extreme values of the AC signal are beyond an input range of the A/D converter.

Another object of the present invention is to provide a method for determining a DC level of an AC signal even if one or both extreme values of the AC signal are beyond an input range of the A/D converter.

A further object of the present invention is to provide a method for offsetting a voltage drift of an AC signal by realizing one or both extreme values of the AC signal first provided that the extreme values are beyond an input range of the A/D converter.

In accordance with an aspect of the present invention, there is provided a method for determining a DC (direct current) level involved in an alternating current signal. The alternating current signal is transmitted from an amplifier to an A/D (analog-to-digital) converter and has a first extreme value. The alternating current signal is shifted by a first level to define a first relative alternating current signal having a first relative extreme value being the first level from the first extreme value. Then the first extreme value is realized according to the first level, the first relative extreme value, and the input range of the A/D converter. Finally, the DC level is determined according to the first extreme value.

In an embodiment, the first extreme value is beyond the input range, and the first relative extreme value is within the input range after the shifting step. The DC level is determined according to the first extreme value and a second extreme value of the alternating current signal, wherein one of the first and second extreme values is a peak value, and the other is a bottom value.

In an embodiment, the shifting step is performed by the amplifier in response to a level control signal. The first level, the first relative extreme value and the input range of the A/D converter are digitally operated to realize a digital value of the first extreme value, and the DC level is determined according to digital value of the first extreme value by a digital signal processor. The level control signal is outputted by the digital signal processor.

In an embodiment, the method for determining the DC level involved in an alternating current signal further comprises steps of shifting the alternating current signal by a second level to define a second relative alternating current signal having a second relative extreme value being the second level from the second extreme value and within the input range of the A/D converter, and realizing the second extreme value according to the second level, the second relative extreme value, and the input range of the A/D converter. The DC level is determined according to the first extreme value and the second extreme value.

The first and second relative extreme values are converted into a digital bottom value Rmin and a digital peak value Rmax by the A/D converter, and detected by a bottom and a peak detectors of a digital signal processor, respectively.

The digital value Amin of the first extreme value is defined by Rmin−[L1×(Dmin/Vmin)], and a digital value Amax of the second extreme value is defined by Rmax+[L2×(Dmax/Vmax)] in which L1 is the first level, Dmin is a digital value of a lower limit of the input range, Vmin is a lower voltage limit of the input range, L2 is the second level, Dmax is a digital value of an upper limit of the input range, and Vmax is an upper voltage limit of the input range. As a result, the DC level is defined by [(Amax+Amin)/2]×Vmax/Dmax or [(Amax+Amin)/2]×Vmin/Dmin or [(Amax+Amin)/2]×(|Vmin|+|Vmax|)/(|Dmin|+|Dmax|).

In accordance with another aspect of the present invention, there is provided a method for realizing an extreme value of an alternating current signal transmitted from an amplifier to an A/D (analog-to-digital) converter, wherein the extreme value is beyond an input range of the A/D converter. The method comprises steps of shifting the alternating current signal by a level to define a relative alternating current signal having a relative extreme value being the level from the extreme value and located within the input range of the A/D converter, and realizing the extreme value according to the level, the relative extreme value, and the input range of the A/D converter.

In accordance with another aspect of the present invention, there is provided a method for offsetting a voltage drift of an alternating current signal transmitted from an amplifier to an analog-to-digital (A/D) converter. The alternating current signal has a non-zero DC level and at least one extreme values beyond an input range of the A/D converter. The method includes steps of shifting the alternating current signal in a manner to define a relative alternating current signal having a peak value and a bottom value of the relative alternating current signal located within the input range of the A/D converter, realizing peak and bottom values of the alternating current signal according to the shifting manner, the peak and bottom values of the relative alternating current signal, and the input range of the A/D converter, determining the DC level according to the peak and bottom values of the alternating current signal, and offsetting the voltage drift according to the DC level.

Preferably, the DC level is adjusted to a zero level in the offsetting step.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
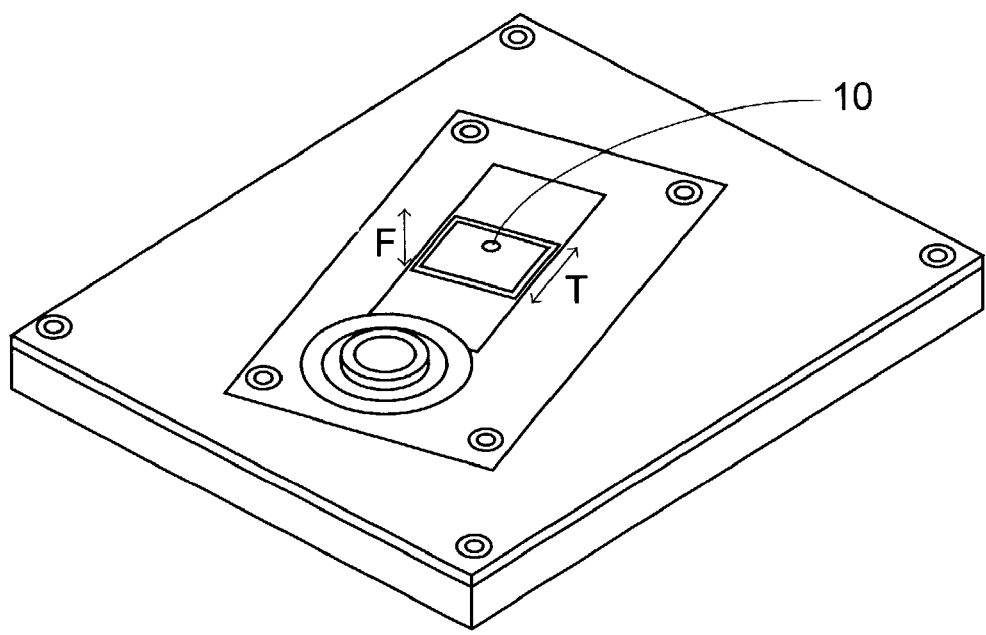
FIG. 1 schematically illustrates a typical optical pickup head.
Figure 2:
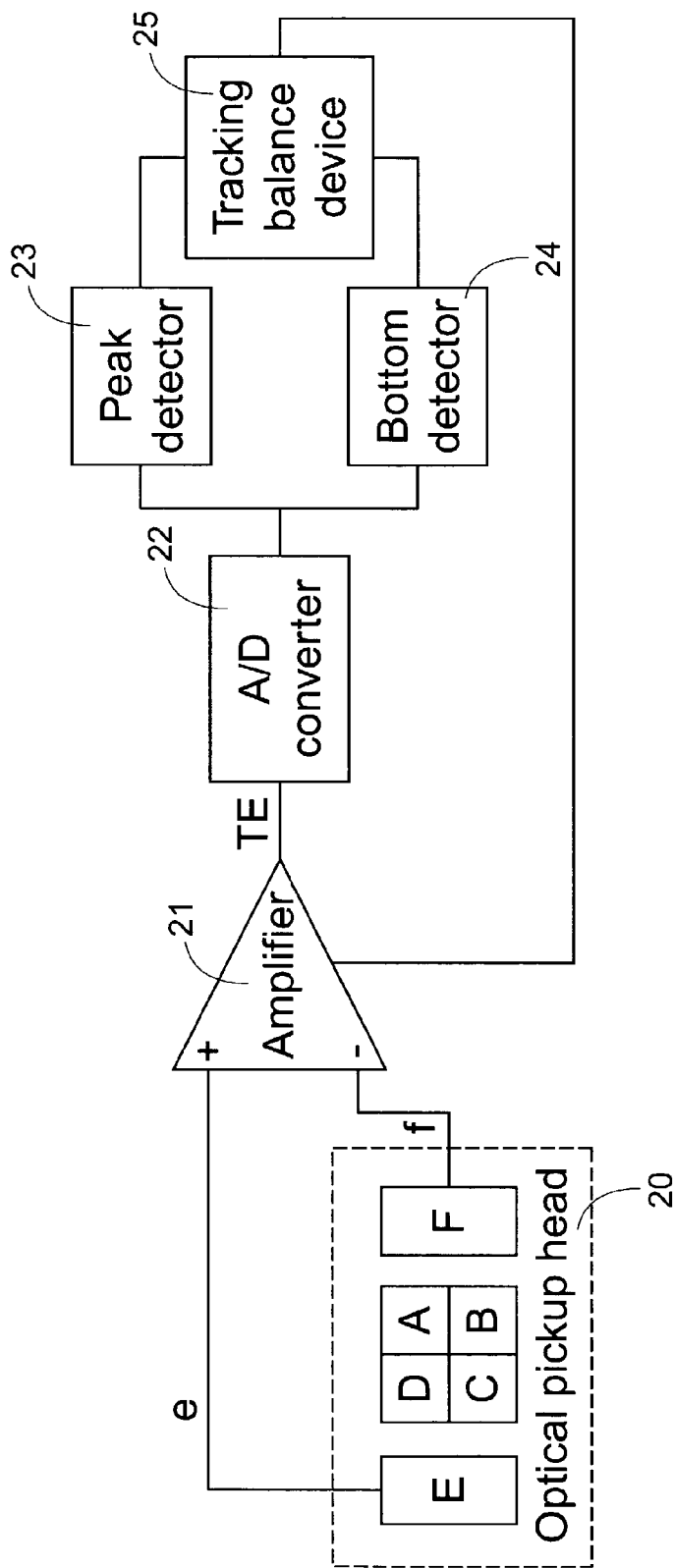
FIG. 2 is a functional block diagram illustrating a typical tracking control system for an optical pickup head.
Figure 3A:
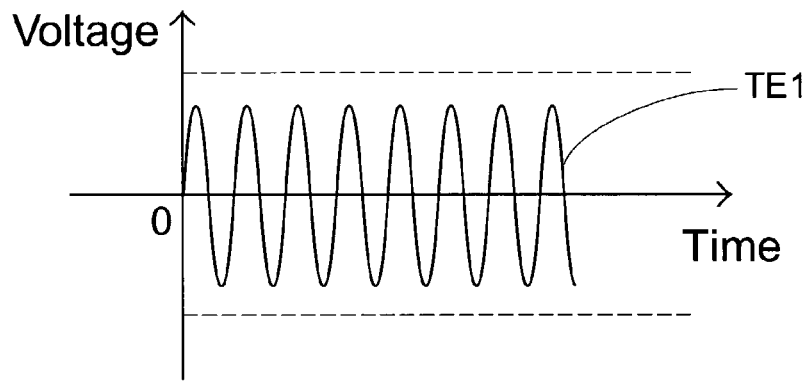
FIGS. 3(a), 3(b) and 3(c) respectively show three possible situations of tracking error signals.
Figure 3B:
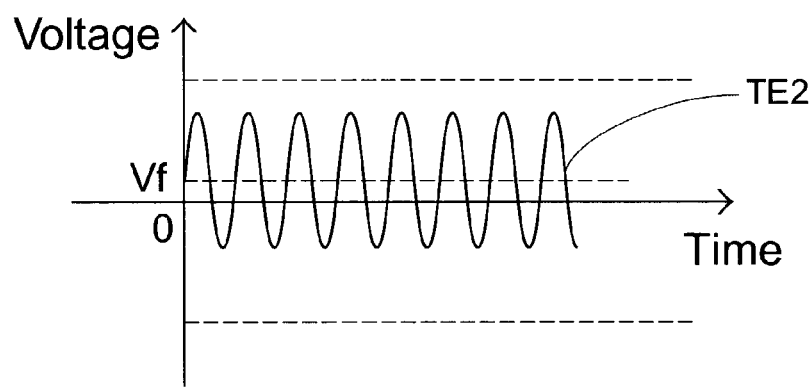
Figure 3C:
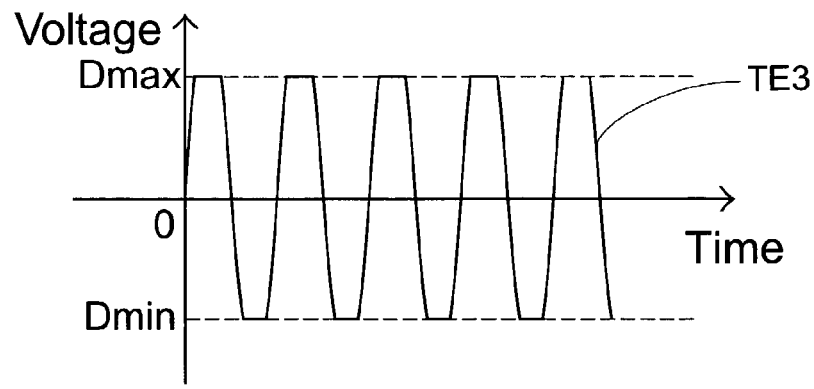
Figure 4:
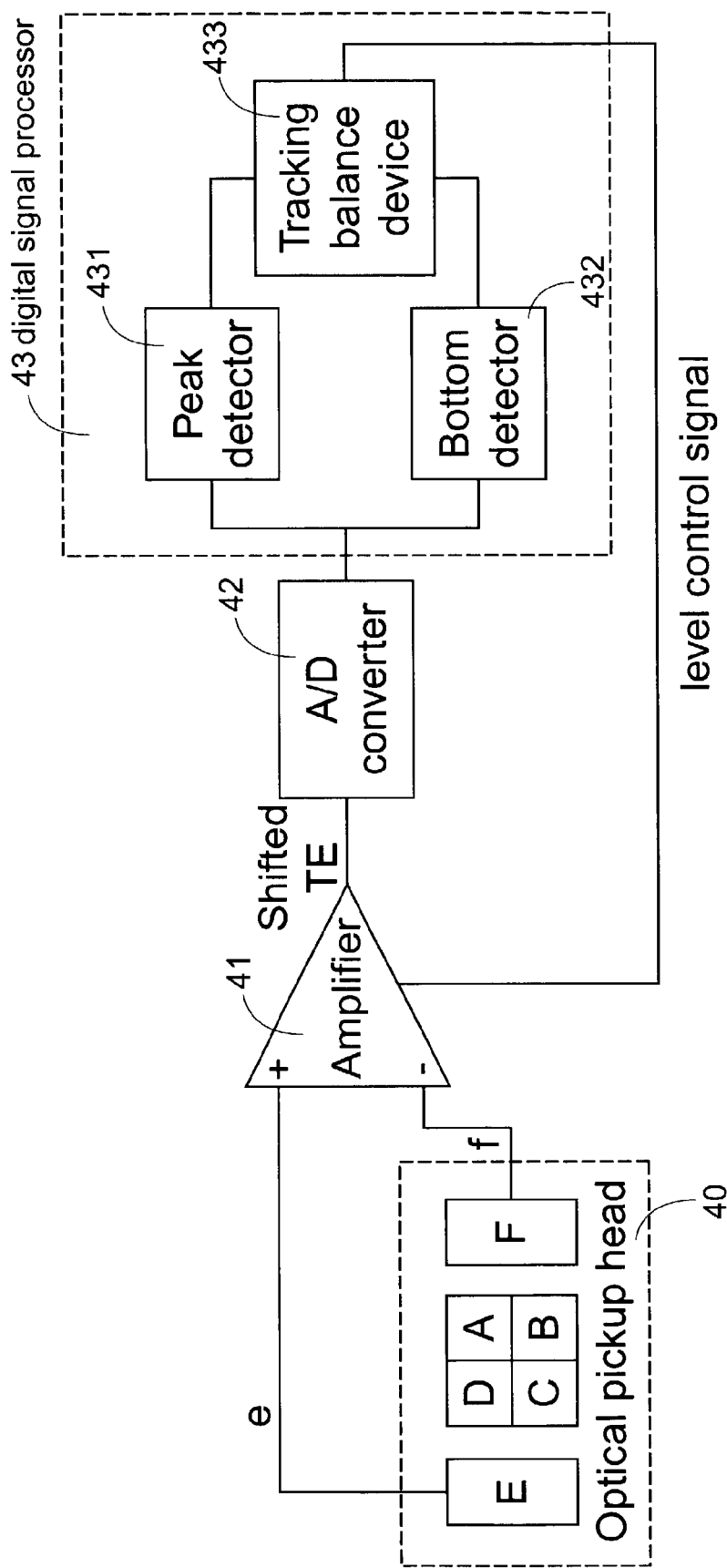
FIG. 4 is a functional block diagram illustrating a tracking control system for an optical pickup head according to the present invention.
Figure 5A:
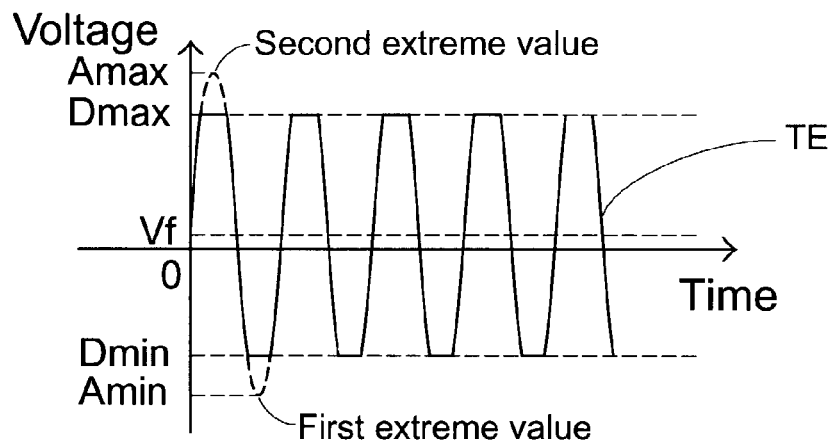
FIGS. 5(a), 5(b) and 5(c) schematically show the steps of realizing extreme values of an AC signal when the extreme values thereof are beyond an input range of the A/D converter.
Figure 5B:
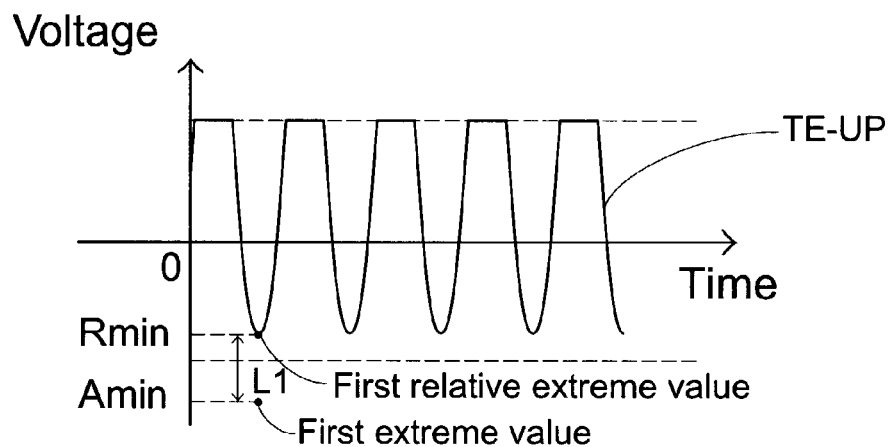
Figure 5C:
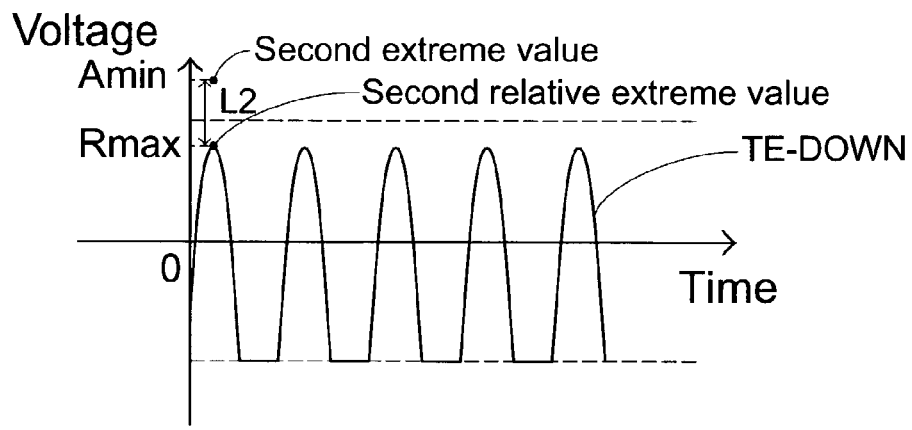

In order to overcome the problems in the prior art, a tracking control system for an optical pickup head is developed according to the present invention. Referring to FIG. 4, the optical pickup head 40 has six light receiving parts A, B, C, D, E and F for producing output signals when receiving light reflected from the optical disk. The output signals e and f are amplified through an operational amplifier 41 to produce a tracking error signal TE in a form of alternating current. In the situation shown in FIG. 5(a), the tracking error signal TE having a bottom value (shown as the first extreme value) and a peak value (shown as the second extreme value) beyond an input range (Dmin to Dmax) of an analog-to-digital (A/D) converter 42 of FIG. 4. In accordance with the present invention, the tracking error signal TE is shifted by a first level L1 by the operational amplifier 41 to define a first relative tracking error signal TE-UP having a relative bottom value (shown as the first relative extreme value, Rmin) located within the input range of the A/D converter 42, as can be seen in FIG. 5(b). Likewise, the tracking error signal TE is shifted by a second level L2 by the operational amplifier 41 to define a second relative tracking error signal TE-DOWN having a relative peak value (shown as the second relative extreme value, Rmax) located within the input range of the A/D converter 42, as can be seen in FIG. 5(c). The relative peak and bottom values Rmax and Rmin are then converted into digital data by the A/D converter 42, and determined by a peak detector 431 and a bottom detector 432, respectively. Based on the peak and bottom values, a tracking balance device 433 computes the voltage drift Vf of FIG. 5(a) to realize a deviation amount of the DC level of the tracking error signal TE.

After being processed by the operational amplifier 41 and the A/D converter 42, a digital value Amin representative of the bottom value of the tracking error signal TE is defined by Rmin−[L1×(Dmin/Vmin)], in which Vmin is a lower voltage limit of the input range of the A/D converter, and Dmin is a digital value of the lower limit of the input range. Similarly, a digital value Amax representative of the peak value of the tracking error signal TE is defined by Rmax+[L2×(Dmax/Vmax)], in which Vmax is an upper voltage limit of the input range of the A/D converter, and Dmax is a digital value of the upper limit of the input range. Therefore, a DC offset level involved in the tracking error signal TE is defined by:

[(Amax+Amin)/2]×Vmax/Dmax;or

[(Amax+Amin)/2]×Vmin/Dmin;or

[(Amax+Amin)/2]×(|Vmin|+|Vmax|)/(|Dmin|+|Dmax|).

The present invention can be illustrated according to the following example for more detailed description. For example, the A/D converter 42 has an input range from −5V (Vmin) to 5V (Vmax), and a resolution of 255. Thus, Dmin and Dmax are digitally defined as −127 and 127, respectively. When the first level L1 is set to be 5×(20/127) Volts, and the relative bottom value Rmin is detected to be −125 by the bottom value detector 432, the digital value Amin of the bottom value is calculated as −145, i.e. −125−[(5×(20/127))×(−127/−5) ]. When the second level L2 is set to be 5×32/127 Volts and the relative peak value Rmax is detected to be 120 by the peak value detector 431, the digital value Amax of the peak value is then calculated as 152, i.e.

120+[5×(32/127)×(127/5)]. Therefore, the DC offset level involved in the tracking error signal TE is computed by:

[(152+(−145))/2 ]×5/127; or

[(152+(−145))/2]×(−5)/(−127); or

[(152+(−145))/2]×(|−5 |+|5|)/(|−127 |+|127|), which all equal to 0.138 Volts.

After the DC level involved in the tracking error signal TE is determined, the voltage drift thereof can be adjusted to a zero level by the operational amplifier 41 in response to a level control signal from the tracking balance device 433. Since the voltage drift is correctly computed, the above-mentioned drawbacks in the prior art can be effectively avoided.

In conclusion, the present invention covers a method for realizing an extreme value A of an alternating current signal transmitted from an amplifier to an A/D converter, wherein the extreme value is beyond an input range of the A/D converter, and the method includes the following steps:

(i) Shifting the alternating current signal by a level L to define a relative alternating current signal having a relative extreme value R being the level L away from the extreme value A and located within the input range of the A/D converter; and (ii) Calculating the extreme value A of the alternating current signal according to the level L, the relative extreme value R, and the input range of the A/D converter, such that, $A=R+[L\times(D/V)]$ when the extreme value is a peak value; or $A=R-[L\times(D/V)]$ when the extreme value is a bottom value, where V is a lower/upper voltage limit of the input range of the A/D converter, and D is a digital value of the lower/upper limit of the input range.

Further, the present invention also covers a method for offsetting a voltage drift of an alternating current signal transmitted from an amplifier to an A/D converter, wherein the alternating current signal has a non-zero DC level and at least one extreme value beyond an input range of the A/D converter, and the method includes the following steps:

(i) Shifting the alternating current signal in a first manner to define a first relative alternating current signal having a first relative extreme value located within the input range of said A/D converter, wherein the first shifting manner is either an up shift or a down shift such that the first relative extreme value of the first relative alternating current signal is at a first level away from the first original extreme value of the alternating current signal;

(ii) Calculating a first original extreme value of the alternating current signal according to the first level, the first relative extreme value, and the input range of the A/D converter;

(iii) Shifting the alternating current signal in a second manner to define a second relative alternating current signal having a second relative extreme value located within the input range of the A/D converter, wherein the second shifting manner shifts to a direction opposite to the first shifting manner such that the second relative extreme value is at a second level away from the second original extreme value;

(iv) Calculating a second original extreme value of the alternating current signal according to the second level, the second relative extreme value, and the input range of the A/D converter;

(v) Calculating a DC offset level according to the first and second original extreme values of the alternating current signal; and (vi) Offsetting the voltage drift of the alternating current signal according to the DC offset level.

The present invention is illustrated by referring to a method for realizing extreme values of a tracking error signal when both extreme values thereof are beyond an input range of the A/D converter. It is understood by a person skilled in the art that the present invention also suitable for a tracking error signal having only one extreme value beyond an input range of the A/D converter.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for determining a direct current (DC) offset level of an alternating current (AC) signal, said alternating current signal being transmitted from an amplifier to an analog-to-digital (A/D) converter and having a first extreme value which is beyond an input range of said A/D converter, said method comprising steps of:

shifting said alternating current signal by a predetermined first level to define a first relative alternating current signal having a first relative extreme value being said predetermined first level away from said first extreme value and lying within said input range of said A/D converter;

realizing said first extreme value according to said predetermined first level, said first relative extreme value, and said input range of said A/D converter;

shifting said alternating current signal by a predetermined second level to define a second relative alternating current signal having a second relative extreme value being said predetermined second level away from said second extreme value and lying within said input range of said A/D converter;

realizing said second extreme value according to said predetermined second level, said second relative extreme value, and said input range of said A/D converter; and determining said DC offset level according to said first extreme value and said second extreme value.

2. The method according to claim 1 wherein one of said first and second extreme values is a peak value, and the other is a bottom value.

3. The method according to claim 1 wherein the steps of shifting said alternating current signal are respectively performed by said amplifier in response to a level control signal.

4. The method according to claim 3 wherein said predetermined first level, said first relative extreme value and said input range of said A/D converter are digitally operated to realize a digital value of said first extreme value, said predetermined second level, said second relative extreme value and said input range of said A/D converter are digitally operated to realize a digital value of said second extreme value, and said DC offset level is determined according to said digital value of said first extreme value and said digital value of said second extreme value by a digital signal processor.

5. The method according to claim 4 wherein said level control signal is outputted from said digital signal processor.

6. The method according to claim 1 wherein said first and second relative extreme values are converted into a digital bottom value Rmin and a digital peak value Rmax by said A/D converter, and detected by a bottom and a peak detectors of a digital signal processor, respectively.

7. The method according to claim 6 wherein a digital value Amin of said first extreme value is defined by Rmin−[L1×(Dmin/Vmin)], and a digital value Amax of said second extreme value is defined by Rmax×[L2×(Dmax/Vmax)] in which L1 is said predetermined first level, Dmin is a digital value of a lower limit of said input range, Vmin is a lower voltage limit of said input range, L2 is said predetermined second level, Dmax is a digital value of an upper limit of said input range, and Vmax is an upper voltage limit of said input range.

8. The method according to claim 7 wherein said DC offset level is defined by:

$$[(Amax+Amin)/2] \times Vmax/Dmax.$$

9. The method according to claim 7 wherein said DC offset level is defined by:

$$[(Amax+Amin)/2] \times Vmin/Dmin.$$

10. The method according to claim 7 wherein said DC offset level is defined by:

$$[(Amax+Amin)/2] \times (|Vmin|+|Vmax|)/(|Dmin|+|Dmax|).$$

11. A method for offsetting a voltage drift of an alternating current signal transmitted from an amplifier to an analog-to-digital (A/D) converter, said alternating current signal having a non-zero direct current (DC) level and at least one extreme value beyond an input range of said A/D converter, said method comprising steps of:

shifting said alternating current signal in either an up or a down shift of a first level to define a first relative alternating current signal having a first relative extreme value of said first relative alternating current signal located within said input range of said A/D converter;

realizing a first original extreme value of said alternating current signal according to said first shifting manner, said first relative extreme value of said first relative alternating current signal, and said input range of said A/D converter;

shifting said alternating current signal in an opposite direction of a second level to define a second relative alternating current signal having a second relative extreme value of said second relative alternating current signal located within said input range of said A/D converter;

realizing a second original extreme value of said alternating current signal according to said second shifting manner, said second relative extreme value of said second relative alternating current signal, and said input range of said A/D converter;

determining a DC offset level according to said first and second original extreme values of said alternating current signal; and offsetting said voltage drift of said alternating current signal according to said DC offset level;

wherein a digital value Amin of said first original extreme value is defined by Rmin−[L1×(Dmin/Vmin)], and a digital value Amax of said second original extreme value is defined by Rmax+[L2×(Dmax/Vmax)], in which Rmin and Rmax are digital bottom value and digital peak value converted from said first and second relative extreme values, respectively, L1 is said first level, Dmin is a digital value of a lower limit of said input range, Vmin is a lower voltage limit of said input range, L2 is said second level, Dmax is a digital value of an upper limit of said input range, and Vmax is an upper voltage limit of said input range.

12. The method according to claim 11 wherein said non-zero DC level is adjusted to a zero level in the step of offsetting said voltage drift.

13. The method according to claim 11 wherein said DC offset level is defined by a formula selected from a group consisting of:

$$[(Amax+Amin)/2] \times Vmax/Dmax;$$

$$[(Amax+Amin)/2] \times Vmin/Dmin; \text{ and}$$

$$[(Amax+Amin)/2] \times (|Vmin|+|Vmax|)/(|Dmin|+|Dmax|).$$

* * * * *